United States Patent [19]

Green et al.

[11] Patent Number: 4,716,050
[45] Date of Patent: Dec. 29, 1987

[54] CHEMICAL VAPOR DEPOSITION OF ALUMINUM ON AN ACTIVATED SURFACE

[75] Inventors: Martin L. Green, New Providence; Roland A. Levy, Berkeley Heights; Ralph G. Nuzzo, Summit, all of N.J.

[73] Assignee: American Telephone and Telegraph Company, AT&T Bell Laboratories, Murray Hill, N.J.

[21] Appl. No.: 928,744

[22] Filed: Nov. 10, 1986

Related U.S. Application Data

[63] Continuation of Ser. No. 861,119, May 7, 1986, abandoned, which is a continuation of Ser. No. 730,674, May 3, 1985, abandoned.

[51] Int. Cl.$^4$ .................... B05D 5/12; C23C 16/20
[52] U.S. Cl. ...................................... 427/99; 427/124; 427/250; 427/252; 427/255; 427/304; 427/404
[58] Field of Search ............... 427/91, 99, 124, 250, 427/252, 253, 255, 304, 299, 314, 404, 419.8

[56] References Cited

U.S. PATENT DOCUMENTS

| | | | |
|---|---|---|---|
| 2,990,295 | 6/1961 | Breining et al. | 427/252 |
| 3,978,252 | 8/1976 | Lombardo et al. | 427/304 |
| 4,315,970 | 2/1982 | McGee | 427/404 |
| 4,328,261 | 5/1982 | Heinecke et al. | 427/252 |
| 4,460,618 | 7/1984 | Heinecke et al. | 427/252 |
| 4,542,074 | 9/1985 | Sirinyan et al. | 428/450 |

FOREIGN PATENT DOCUMENTS

| | | |
|---|---|---|
| 2038883 | 7/1980 | United Kingdom . |
| 2041983 | 9/1980 | United Kingdom . |
| 1594399 | 7/1981 | United Kingdom . |
| 1595659 | 8/1981 | United Kingdom . |
| 1595660 | 8/1981 | United Kingdom . |

OTHER PUBLICATIONS

*Thin Solid Films*, "Aluminum Coatings by the Decomposition of Alkyls", vol. 45 (1977), H. O. Pierson, pp. 257–263.
*Solid State Technology*, "LPCVD of Aluminum and Al–Si Alloys for Semiconductor Metallization", Dec. 1982, M. J. Cooke et al., pp. 62–65.
*Proceedings of the Fourth European Conference on Chemical Vapor Deposition*, "Low Pressure Aluminum CVD", 1983, R. A. H. Heinecke et al., pp. 119–121.

*Primary Examiner*—Sadie L. Childs
*Attorney, Agent, or Firm*—Peter A. Businger

[57] ABSTRACT

Chemical vapor deposition of an aluminum layer on a substrate is facilitated by surface activation prior to deposition. Surface activation is at relatively low temperature and results in a hydrated surface; low temperature surface activation is advantageous in the interest of keeping deposition apparatus free of additional chemicals, and substrates activated in this manner may be stored for considerable lengths of time prior to aluminum deposition. Among suitable activating agents are organochromium, organosilane, and organoaluminum compounds.

9 Claims, 1 Drawing Figure

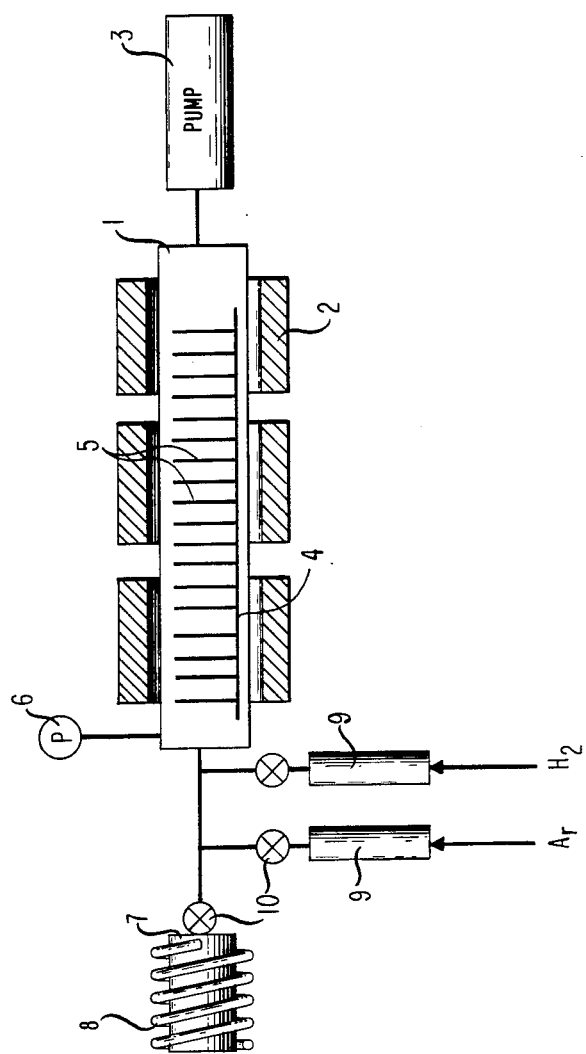

CHEMICAL VAPOR DEPOSITION OF ALUMINUM ON AN ACTIVATED SURFACE

This application is a continuation, of application Ser. No. 861,119, filed May 7, 1986 now abandoned, which is a continuation, of application Ser. No. 730,674, filed May 3, 1985 now abandoned.

FIELD OF THE INVENTION

The invention is concerned with the deposition of aluminum metallization layers in the manufacture of integrated circuit devices.

BACKGROUND OF THE INVENTION

Patterned layers of aluminum serve widely as microminiature electrical circuitry for integrated-circuit semiconductor devices; typically, such layers have been made by evaporation or sputtering in a vacuum. While such physical deposition methods are capable of producing high-quality films, alternatives such as so-called chemical vapor deposition methods are receiving attention as potentially more suitable for large-scale commercial practice.

The field of film deposition is discussed extensively, e.g., in the book by J. L. Vossen et al., *Thin Film Processes*, Academic Press, 1978, and the following are typical items as addressed more specifically to various aspects of chemical vapor deposition methods:

U.S. Pat. No. 2,990,295, "Deposition of Aluminum", issued June 27, 1961 to E. R. Breining et al.;

British patent specification No. 1,594,399, "Improvements in or Relating to Metal Deposition", published July 30, 1981 by R. A. H. Heinecke et al.;

British patent specification No. 1,595,659, "Providing Conductive Tracks on Semiconductor Devices", published Aug. 12, 1981 by R. A. H. Heinecke et al.;

British patent specification No. 1,595,660, "Corrosion Protection of Metal Surfaces", published Aug. 12, 1981 by T. M. Jackson et al.;

British patent application No. 2,041,983, "Metallizing Semiconductor Devices", published Sept. 17, 1980 by R. A. H. Heinecke et al.;

British patent application No. 2,038,883, "Metallizing Semiconductor Devices", published July 30, 1980 by R. H. A. Heinecke et al.;

H. O. Pierson, "Aluminum Coatings by the Decomposition of Alkyls", *Thin Solid Films*, Vol. 45 (1977), pp. 257-263;

M. J. Cooke et al., "LPCVD of Aluminum and Al-Si Alloys for Semiconductor Metallization", *Solid State Technology*, December 1982, pp. 62-65; and R. A. H. Heinecke et al., "Low-pressure Aluminum CVD", *Proceedings of the Fourth European Conference on Chemical Vapor Deposition*, 1983, pp. 119-121.

SUMMARY OF THE INVENTION

An aluminum layer is deposited on a substrate in the manufacture of integrated circuit devices. Chemical vapor deposition is preferred, especially on account of enhanced step coverage, and metal-organic precursor compounds have advantageously high volatility. Surface activation prior to deposition results in enhanced density and continuity of deposited layers; preferred surface activation results in a hydrated surface and is carried out at relatively low temperatures such as, typically, temperatures at or near room temperature.

BRIEF DESCRIPTION OF THE DRAWING

The FIGURE schematically shows a chemical vapor deposition apparatus as may be used to produce aluminum metallizations on activated surfaces.

DETAILED DESCRIPTION

The FIGURE shows quartz reaction tube 1 with three-zone furnace 2, mechanical vacuum pump 3, substrate holder 4, substrates 5, pressure gauge 6, evaporation chamber 7 with heating coil 8, flowmeters 9, and valves 10.

Prior to a step of aluminum deposition a substrate surface is activated by a surface treatment which results in a hydrated surface; such treatment is at relatively low temperature, such as, preferably, a temperature of less than 100 degrees C. (A hydrated surface here is defined as a surface bearing a layer comprising a significant density of hydroxyls.) Typical substrate materials are silicon, oxidized silicon, silica, alumina, and doped silicate glasses such as, e.g., phosphosilicate glasses or boro-phosphosilicate glasses.

The preferred treatment comprises establishing, on a clean substrate surface, a layer comprising hydroxyl groups, derivatizing this layer so as to formally replace hydrogen ions in hydroxyl groups by organic, inorganic, or organometallic ligand groups having enhanced environmental, vacuum, and thermal stability, or by appropriate metal ions such as, e.g., ions of chromium or aluminum, and decomposing the derivatized layer as aluminum deposition is initiated. The efficacy of the surface activation treatment is understood as predicated most likely on the formation of nucleation sites upon decomposition of the derivatized layer, such sites consisting of ions, complexes, or atoms which may be of the same or of different species as that of the metallization. Prior to application of an activating agent a substrate surface preferably is cleaned by means of an acid, followed by thorough rinsing.

Conveniently, hydroxyl groups are established by exposure to rinsing water, and derivatizing is preferably carried out by exposure to an organo-metallic compound such as, e.g., an organochromium, organosilane, or organoaluminum compound; in the latter case such compound may be the same as the precursor compound used for aluminum deposition.

As a result of such surface activation, and in the interest of continuity and high density of a deposited aluminum layer, a density of activation sites of at least $10^{13}/cm^2$ is obtained.

Encompassed by the method as described above are variants which may be chosen for specific effects such as, e.g., texture control as follows:

(i) If hydroxyl groups are derivatized with an organochromium compound, orientation of subsequently deposited aluminum is found to be weak (100) and almost random. Some (111) orientation is obtained when hydrogen is used as a diluent of organoaluminum during deposition.

(ii) If hydroxyl groups are derivatized with an organosilane compound, fairly strong (111) orientation is produced in subsequently deposited aluminum.

(iii) If hydroxyl groups are derivatized by room-temperature exposure to an aluminum alkyl, medium-strength (111) orientation of the deposited aluminum is obtained provided adequate care is taken to maintain the effectiveness of surface activation, e.g., by prompt exposure of the activated surface to an aluminum alkyl deposition ambient.

(iv) If hydroxyl groups are derivatized with an organosilane compound and the resulting layer is then exposed to an aluminum alkyl compound at room temperature, strong (111) orientation is obtained in a subsequently deposited aluminum layer.

Texture is readily ascertained from an X-ray diffraction pole figure; in the case of strong (111) texture, ratios of 40 to 50 were observed between the intensities of the strongest and the weakest contour lines. Such strong (111) texture is considered to be particularly desirable in aluminum layers in view of enhanced resistance to electromigration as exhibited by such layers; see, e.g., S. Vaidya et al., "Effect of Texture and Grain Structure on Electromigration in Al—0.5% Cu Thin Films", *Thin Solid Films*, Vol. 75 (1981), pp. 253-259.

As contrasted with prior art high-temperature surface activation inside of deposition apparatus, the new method permits surface activation separate from deposition and, depending on choice of activation agent, activated substrates are capable of being stored up to several days without undue loss of effectiveness of the activation layer. Furthermore, activation is simplified, making unnecessary the introduction of gaseous activating agents or reagents into deposition apparatus, and rendering optional the introduction of foreign metal atoms. (In the absence of such foreign atoms the risk of contamination of a deposited layer as well as of deposition apparatus is minimized.)

Deposition of aluminum on the activated surface is conveniently carried out, e.g., by means of apparatus as shown in the Figure; see the examples below for procedures as typically followed in the use of such apparatus. Typically, device manufacture further involves patterning of a deposited layer, patterns being defined photolithographically in a light sensitive layer and then transferred by some form of etching of the aluminum layer.

EXAMPLE 1

A silicon substrate wafer having a diameter of 2 inches was treated for surface activation by immersion in hydrofluoric acid for 1 minute, rinsed in highly pure water at room temperature for 1 minute, rinsed further in highly pure boiling water for 5 minutes, dried by spinning, immersed in a solution of 10 percent organochromium complex Du Pont "Quilon" in isopropanol for 10 minutes, immersed in pure isopropanol for 5 minutes, and dried by spinning.

The activated substrate was loaded onto a quartz carrier and placed in the reaction tube. The tube was evacuated three times by pumping to a pressure of approximately 10 millitorr; after each step of evacuation the tube was back-filled with purified argon. While pumping continued the substrate was heated to a deposition temperature of approximately 250 degrees C. Triisobutylaluminum was allowed to enter from a heated reservoir via a needle valve into the reaction tube. Pyrolysis of the aluminum alkyl at the substrate resulted in aluminum deposition; organic by-products and unreacted alkyl were pumped out of the system and exhausted. Pressure in the reaction tube was approximately 250 millitorrs during deposition. Deposition of a layer having a thickness of approximately 1.5 micrometer took approximately 30 minutes. The deposited layer was found to consist of highly pure aluminum and to contain less than 0.1 atom percent carbon and less than 0.1 atom percent oxygen. Resistivity was approximately 3 microohm-centimeters, and average grain size was approximately 2 micrometers. Texture was weak (100) and almost random.

EXAMPLE 2

The procedure described above in Example 1 was applied similarly except that Du Pont "Volan" organochromium complex was employed as activating agent. Layer properties were essentially as given in Example 1 above.

EXAMPLE 3

A silicon substrate wafer was treated for surface activation by immersion in hydrofluoric acid for 1 minute, rinsed in highly pure water at room temperature for 1 minute, rinsed further in highly pure boiling water for 5 minutes, dried by spinning, immersed in a solution of 10 percent aminopropyldimethylethoxysilane in methylene chloride for 10 minutes, immersed in pure methylene chloride for 5 minutes, and dried by spinning. Aluminum was then deposited as described in Example 1 above. Layer properties were essentially as given in Example 1 above except that the deposited layer had fairly strong (111) orientation.

EXAMPLE 4

The procedure described above in Example 3 was applied similarly except that the substrate was a layer of thermal silicon oxide having a thickness of approximately 0.1 micrometer on silicon. Layer properties were essentially as given in Example 3 above.

What is claimed is:

1. In the manufacture of semiconductor integrated devices, a method for depositing an aluminum layer on a surface,
   said depositing being by chemical vapor deposition while said substrate is heated at a desired temperature, and
   said method comprising treating said surface, prior to said depositing, with an activating agent so as to produce on said surface a surface layer comprising hydroxyl groups, derivatizing said surface layer, and decomposing the derivatized layer.

2. Method of claim 1 in which said surface is treated with said activating agent while said substrate is at a temperature which is less than 100 degrees C.

3. Method of claim 1 in which hydroxyl groups are established on said surface prior to treatment with said activating agent.

4. Method of claim 3 in which hydroxyl groups are established by rinsing.

5. Method of claim 4 in which said surface is cleaned by acid prior to rinsing.

6. Method of claim 1 in which said activating agent is an organochromium compound.

7. Method of claim 1 in which said activating agent is an organosilane compound.

8. Method of claim 1 in which said activating agent is an aluminum alkyl compound.

9. Method of claim 1 in which said activating agent is an organosilane compound followed by an aluminum alkyl compound.

* * * * *